US012584218B2

(12) United States Patent
Moradian et al.

(10) Patent No.: US 12,584,218 B2
(45) Date of Patent: Mar. 24, 2026

(54) PLATE ASSEMBLIES, PROCESS KITS, AND PROCESSING CHAMBERS FOR SEMICONDUCTOR MANUFACTURING

(71) Applicant: Applied Materials, Inc., Santa Clara, CA (US)

(72) Inventors: Ala Moradian, Sunnyvale, CA (US); Manjunath Subbanna, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 490 days.

(21) Appl. No.: 18/122,506

(22) Filed: Mar. 16, 2023

(65) Prior Publication Data

US 2024/0254624 A1 Aug. 1, 2024

(30) Foreign Application Priority Data

Jan. 27, 2023 (IN) .............................. 202341005426

(51) Int. Cl.
*C23C 16/455* (2006.01)
*C23C 16/458* (2006.01)
*C23C 16/46* (2006.01)

(52) U.S. Cl.
CPC .... *C23C 16/45502* (2013.01); *C23C 16/4583* (2013.01); *C23C 16/46* (2013.01)

(58) Field of Classification Search
None
See application file for complete search history.

(56) References Cited

U.S. PATENT DOCUMENTS

| | | | |
|---|---|---|---|
| 10,861,722 B2 | 12/2020 | Colombeau et al. | |
| 2001/0008173 A1* | 7/2001 | Watanabe | H01J 37/32623 |
| | | | 156/345.46 |
| 2012/0055632 A1 | 3/2012 | de la Llera et al. | |
| 2012/0263875 A1 | 10/2012 | Brenninger et al. | |
| 2015/0097486 A1* | 4/2015 | Nguyen | H01J 37/32082 |
| | | | 239/548 |

(Continued)

FOREIGN PATENT DOCUMENTS

| | | |
|---|---|---|
| EP | 1568797 A2 | 8/2005 |
| KR | 20150120413 A | 10/2015 |
| WO | 2022031406 A1 | 2/2022 |

OTHER PUBLICATIONS

Wang, Fuyuan et al., "The influence of substrate morphology on the thermal radiation properties of SiC coating", Nov. 2, 2020, Applied Physics A, Springer, pp. 1-8, <https://doi.org/10.1007/s00339-020-04089-x>.

(Continued)

*Primary Examiner* — Jason Berman
(74) *Attorney, Agent, or Firm* — Patterson + Sheridan, LLP

(57) ABSTRACT

Embodiments of the present disclosure relate to plate assemblies, process kits, processing chambers, and related components and methods for semiconductor manufacturing. In one implementation, a plate assembly for disposition in a processing chamber includes an inner section that includes an opaque material. The inner section has an outer diameter. The plate assembly includes a first outer section that is arcuate in shape and includes the opaque material. The first outer section includes a first inner shoulder, and a first inner lip extending inwardly relative to the first inner shoulder.

20 Claims, 9 Drawing Sheets

(56) References Cited

U.S. PATENT DOCUMENTS

2018/0114680 A1    4/2018   Kim et al.
2022/0325400 A1   10/2022   Cong et al.

OTHER PUBLICATIONS

Engineering ToolBox, Emissivity Coefficients common Products. [online] Available at: https://www.engineeringtoolbox.com/emissivity-coefficients-d_447.html [Last Accessed Mar. 15, 2023].
Heraeus Black Quartz (HBQ®), Last Accessed Mar. 15, 2023, <https://www.heraeus.com/en/hca/products_and_solutions_hca/material_grades_brands/brands_hbq_black_quartz.html>.
International Search Report and Written Opinion dated May 9, 2024 for Application No. PCT/US2024/011865.

\* cited by examiner

980

1080

1180

1180

1180

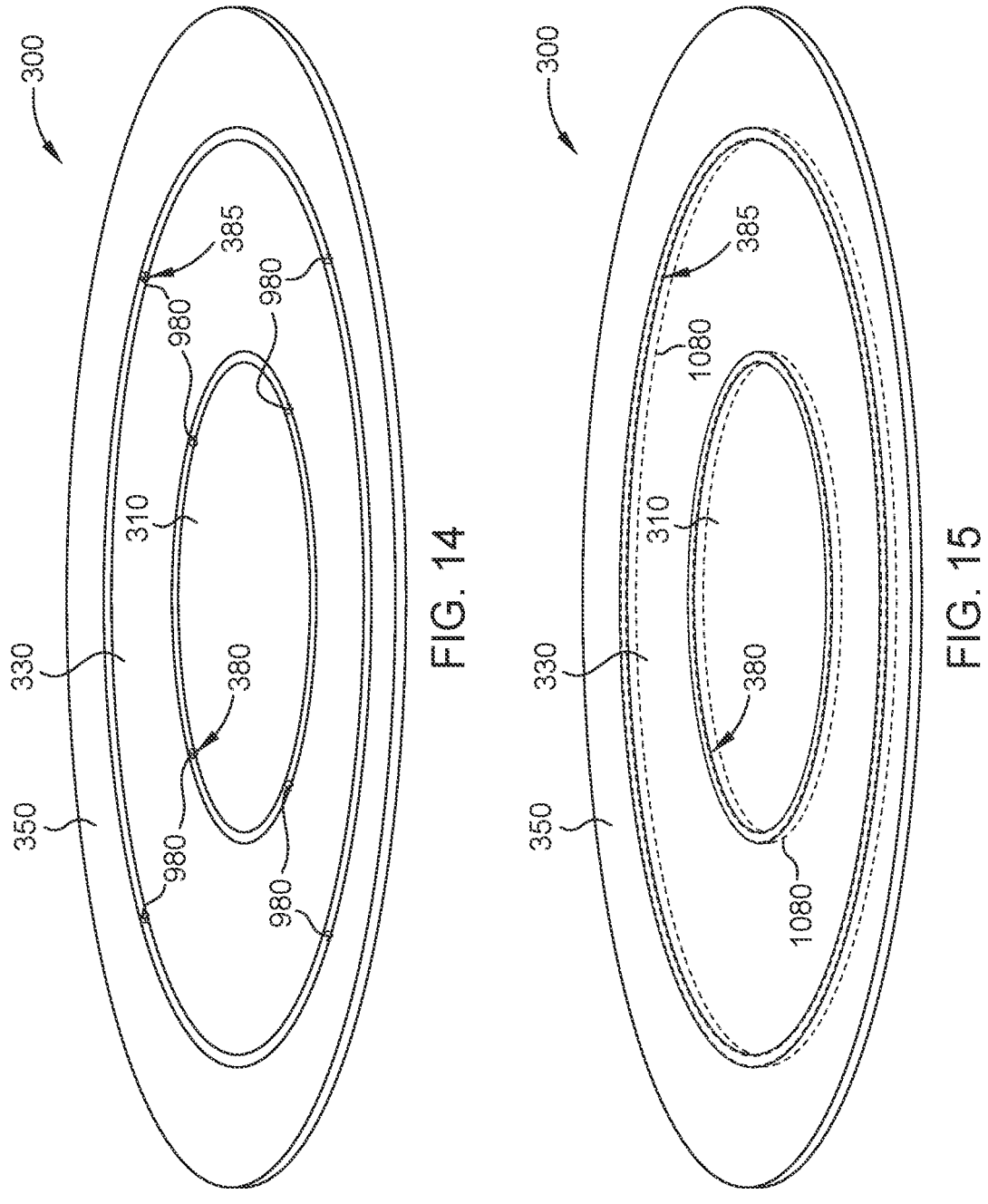

PLATE ASSEMBLIES, PROCESS KITS, AND PROCESSING CHAMBERS FOR SEMICONDUCTOR MANUFACTURING

CROSS-REFERENCE TO RELATED APPLICATION

This application claims priority to India provisional patent application serial number 202341005426, filed Jan. 27, 2023, which is herein incorporated by reference in its entirety.

BACKGROUND

Field

Embodiments of the present disclosure relate to plate assemblies, process kits, processing chambers, and related components and methods for semiconductor manufacturing.

Description of the Related Art

Semiconductor substrates are processed for a wide variety of applications, including the fabrication of integrated devices and microdevices. One method of processing substrates includes depositing a material, such as a semiconductor material or a conductive material, on a surface of the substrate. For example, epitaxy is one deposition process that deposit films of various materials on a surface of a substrate in a processing chamber.

During processing gases can flow to different parts of a chamber (e.g., diversive flow), which can hinder deposition uniformity and film thickness. Efforts to address such issues can involve contamination, difficulty in cleaning, and/or limited thermal control and adjustability. Such issues can be exacerbated by relatively complex deposition operations.

Therefore, a need exists for improved apparatus and methods that facilitate one or more of quick and efficient heating, ease of cleaning, and/or thermal zonal control and adjustability.

SUMMARY

Embodiments of the present disclosure relate to plate assemblies, process kits, processing chambers, and related components and methods for semiconductor manufacturing.

In one implementation, a plate assembly for disposition in a processing chamber includes an inner section that includes an opaque material. The inner section has an outer diameter. The plate assembly includes a first outer section that is arcuate in shape and includes the opaque material. The first outer section includes a first inner shoulder, and a first inner lip extending inwardly relative to the first inner shoulder.

In one implementation, a process kit for disposition in a processing chamber includes a liner that includes an inner surface, the inner surface having an inner liner diameter. The process kit includes a plate assembly. The plate assembly includes an inner section that having an outer diameter that is lesser than the inner liner diameter, and one or more outer sections that are arcuate in shape. The one or more outer sections include an outermost section sized and shaped to interface with the liner.

In one implementation, a processing chamber applicable for use in semiconductor manufacturing includes a chamber body. The chamber body includes an internal volume, a plurality of gas inject passages formed in the chamber body, and one or more gas exhaust passages formed in the chamber body. The processing chamber includes one or more heat sources configured to generate heat, and a liner disposed in the internal volume and lining at least part of one or more sidewalls of the chamber body. The liner includes an inner surface. The processing chamber includes a plate assembly disposed in the internal volume and at least partially defining a processing volume of the internal volume. The plate assembly includes an inner section that includes an opaque material, and one or more outer sections that are arcuate in shape and include the opaque material. The one or more outer sections include an outermost section interfacing with the liner. The processing chamber includes a substrate support assembly positioned in the processing volume. The substrate support assembly includes a plurality of lift pins, and one or more substrate supports.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 14 is a partial schematic axonometric bottom view of the plate assembly shown in FIG. 13, according to one implementation.

FIG. 15 is a partial schematic axonometric bottom view of the plate assembly shown in FIG. 13, according to one implementation.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure relate to plate assemblies, process kits, processing chambers, and related components and methods for semiconductor manufacturing.

The disclosure contemplates that terms such as "couples," "coupling," "couple," and "coupled" may include but are not limited to welding, fusing, melting together, interference fitting, and/or fastening such as by using bolts, threaded connections, pins, and/or screws. The disclosure contemplates that terms such as "couples," "coupling," "couple," and "coupled" may include but are not limited to integrally forming. The disclosure contemplates that terms such as "couples," "coupling," "couple," and "coupled" may include but are not limited to direct coupling and/or indirect coupling, such as indirect coupling through components such as links, blocks, and/or frames.

Figure 1:
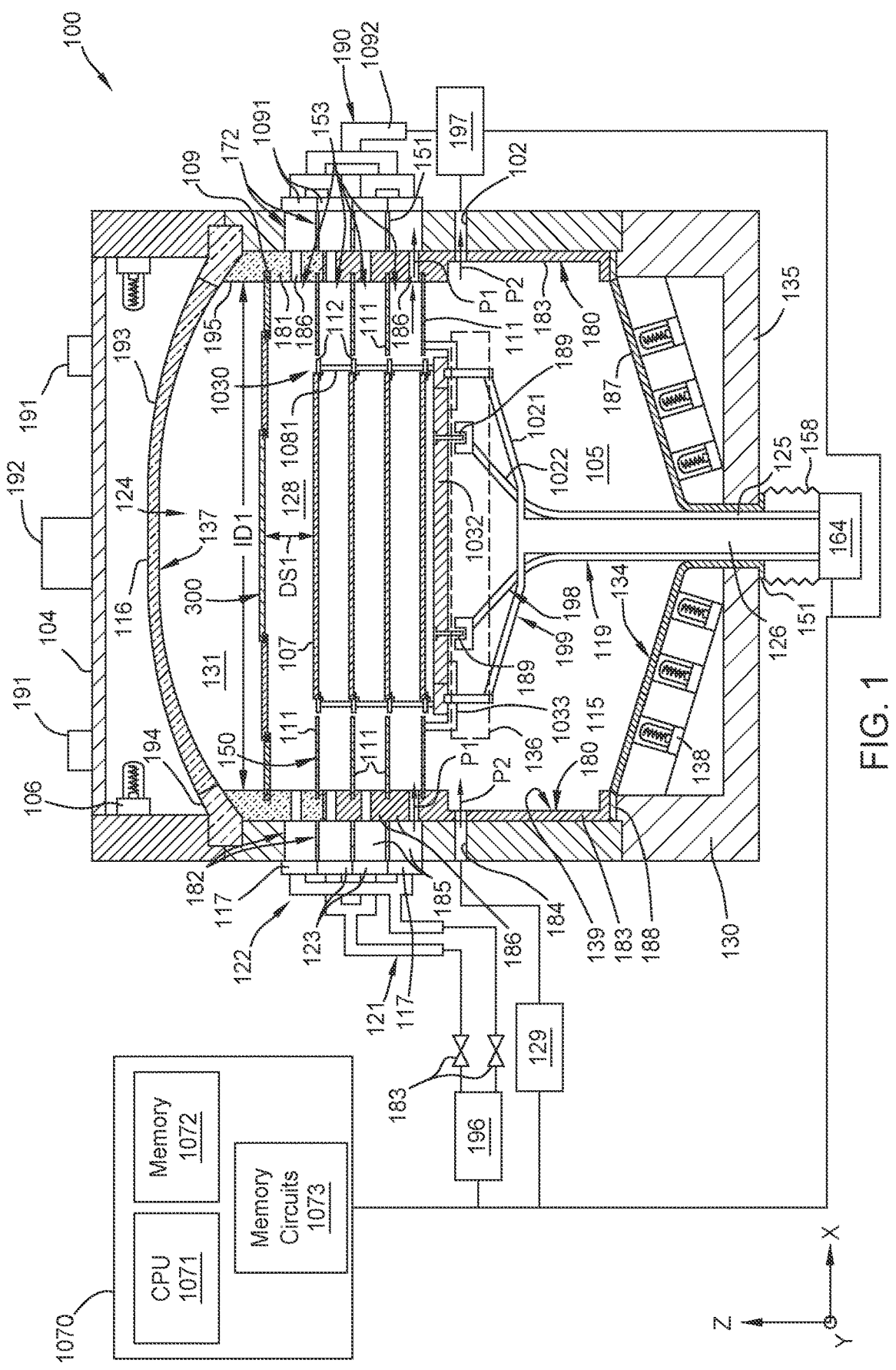
FIG. 1 is a schematic cross-sectional side view of a processing apparatus, according to one implementation.
Figure 2:
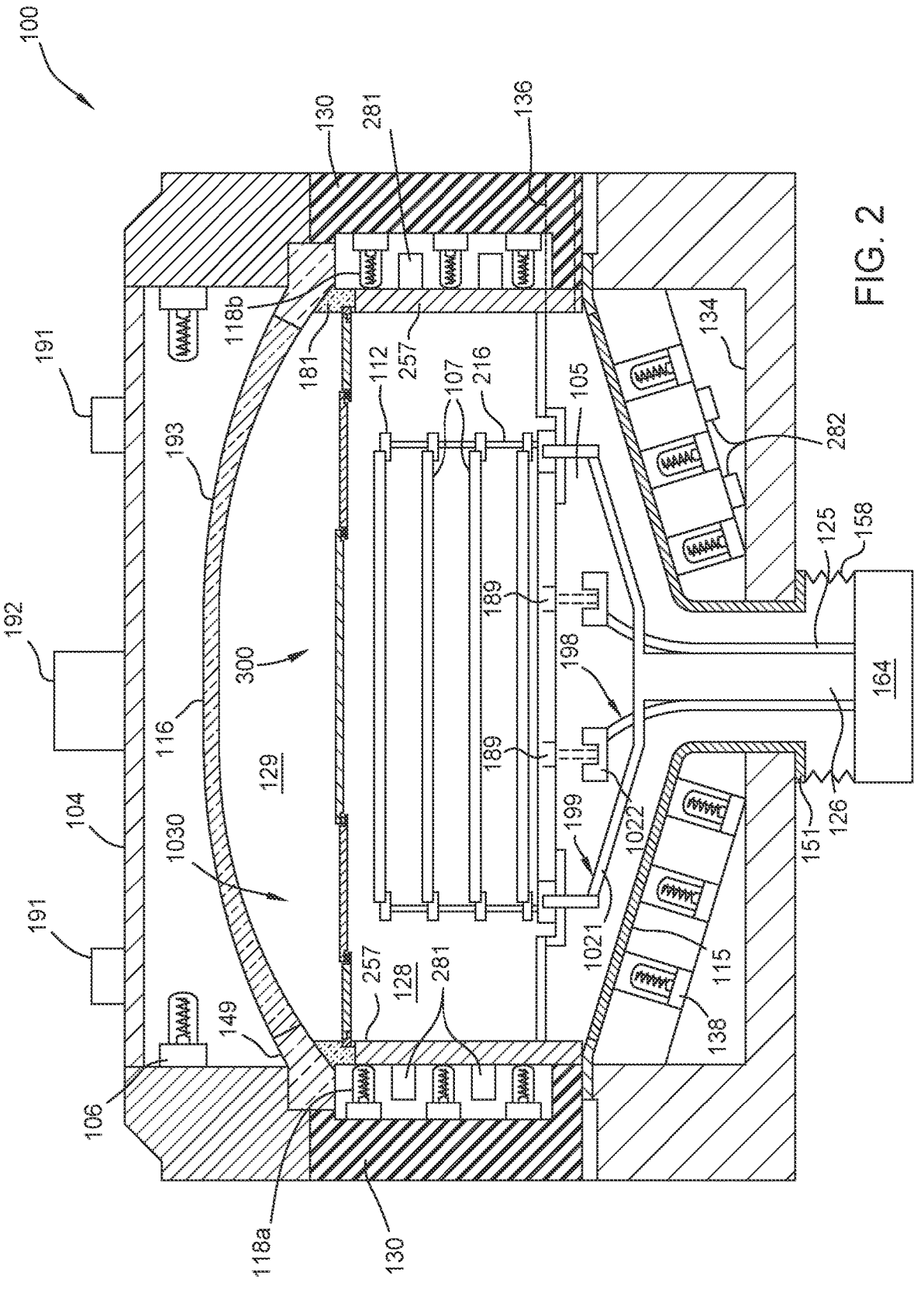
FIG. 2 is a schematic cross-sectional side view of the processing apparatus shown in FIG. 1, according to one implementation.

FIG. 1 is a schematic cross-sectional side view of a processing apparatus 100, according to one implementation. The side heat sources 118a, 118b shown in FIG. 2 are not shown in FIG. 1 for visual clarity purposes. The processing apparatus 100 includes a processing chamber having a chamber body 130 that defines an internal volume 124. The processing apparatus 100 includes a plate assembly 300 disposed in the internal volume and at least partially defining a processing volume 128 of the internal volume 124. The plate assembly 300 is discussed further below.

A cassette 1030 is positioned in the processing volume 128 and at least partially supported by a substrate support assembly 119 (such as a pedestal assembly). The cassette 1030 includes a cassette plate 1032 and a plurality of levels that support a plurality of substrates 107 for simultaneous processing (e.g., epitaxial deposition). The present disclosure contemplates that the cassette plate 1032 can be omitted. In the implementation shown in FIG. 1, the cassette 1030 supports four substrates. The cassette 1030 can support other numbers of substrates, including but not limited to two substrates 107, three substrates 107, four substrates 107, six substrates 107, or eight substrates 107. In one or more embodiments, the cassette 1030 supports two substrates 107 or three substrates 107. The processing apparatus 100 includes an upper window 116, such as a dome, disposed between a lid 104 and the processing volume 128.

The processing apparatus 100 includes a lower window 115 disposed below the processing volume 128. One or more upper heat sources 106 are positioned above the processing volume 128 and the upper window 116. The one or more upper heat sources 106 can be radiant heat sources such as lamps, for example halogen lamps. The one or more upper heat sources 106 are disposed between the upper window

116 and the lid 104. The upper heat sources 106 are positioned to provide uniform heating of the substrates 107. One or more lower heat sources 138 are positioned below the processing volume 128 and the lower window 115. The one or more lower heat sources 138 can be radiant heat sources such as lamps, for example halogen lamps. The lower heat sources 138 are disposed between the lower window 115 and a floor 134 of the internal volume 124. The lower heat sources 138 are positioned to provide uniform heating of the substrates 107.

The present disclosure contemplates that other heat sources may be used (in addition to or in place of the lamps) for the various heat sources described herein. For example, resistive heaters, light emitting diodes (LEDs), and/or lasers may be used for the various heat sources described herein.

The upper and lower windows 116, 115 may be transparent to the infrared radiation, such as by transmitting at least 80% (such as at least 95%) of infrared radiation. The upper and lower windows 116, 115 may be a quartz material (such as a transparent quartz). In one or more embodiments, the upper window 116 includes an inner window 193 and outer window supports 194. The inner window 193 may be a thin quartz window. The outer window supports 194 support the inner window 193 and are at least partially disposed within a support groove. In one or more embodiments, the lower window 115 includes an inner window 187 and outer window supports 188. The inner window 187 may be a thin quartz window. The outer window supports 188 support the inner window 187.

The substrate support assembly 119 is disposed in the processing volume 128. One or more liners 180 are disposed in the processing volume 128 and surround the substrate support assembly 119. The one or more liners 180 facilitate shielding the chamber body 130 from processing chemistry in the processing volume 128. The chamber body 130 is disposed at least partially between the upper window 116 and the lower window 115. The one or more liners 180 are disposed between the processing volume 128 and the chamber body 130. The one or more liners 180 include an upper liner 181 and one or more lower liners 183.

The upper liner 181 and the plate assembly 300 are at least part of a process kit disposed in the processing apparatus 100. The upper liner 181 includes an inner surface 195 having an inner liner diameter ID1, and a recess 109 formed in the inner surface 195.

The processing apparatus 100 includes a plurality of gas inject passages 182 formed in the chamber body 130 and in fluid communication with the processing volume 128, and one or more gas exhaust passages 172 (a plurality is shown in FIG. 1) formed in the chamber body 130 opposite the plurality of gas inject passages 182. The one or more gas exhaust passages 172 are in fluid communication with the processing volume 128. Each of the plurality of gas inject passages 182 and one or more gas exhaust passages 172 are formed through one or more sidewalls of the chamber body 130 and through the one or more liners 180 that line the one or more sidewalls of the chamber body 130.

Each gas inject passage 182 includes a gas channel 185 formed in the chamber body 130 and one or more gas openings 186 (one is shown in FIG. 1) formed in the one or more liners 180. One or more supply conduit systems are in fluid communication with the gas inject passages 182. In FIG. 1, an inner supply conduit system 121 and an outer supply conduit system 122 are in fluid communication with the gas inject passages 182. The inner supply conduit system 121 includes a plurality of inner gas boxes 123 mounted to the chamber body 130 and in fluid communication with an inner set of the gas inject passages 182. The outer supply conduit system 122 includes a plurality of outer gas boxes 117 mounted to the chamber body 130 and in fluid communication with an outer set of the gas inject passages 182. The present disclosure contemplates that a variety of gas supply systems (e.g., supply conduit system(s), gas inject passages, and/or gas boxes different than what is shown in FIG. 1) may be used.

The processing apparatus 100 includes a flow guide structure 150 having one or more flow dividers 111 positioned outwardly of the cassette 1030. Four flow dividers 111 are shown in FIG. 1. Other numbers (such as two or three) of the flow dividers 111 may be used. The flow guide structure 150 divides the processing volume into a plurality of flow levels 153 (four flow levels are shown in FIG. 1). In one or more embodiments, the flow guide structure 150 includes at least two (such as at least three) flow levels 153. The plurality of gas inject passages 182 are positioned as a plurality of inject levels such that each gas inject passage 182 corresponds to one of the plurality of inject levels. Each inject level aligns with a respective flow level 153.

The flow guide structure 150, the one or more liners 180 (such as the upper liner 181 and/or the one or more lower liners 183), and/or the cassette 1030 are formed of one or more of quartz (such as transparent quartz, e.g. clear quartz, opaque quartz, e.g. white quartz, and/or black quartz), silicon carbide (SiC), and/or graphite coated with SiC.

The one or more flow dividers 111 are coupled to and/or at least partially supported by the one or more liners 180. Portions (e.g., the one or more flow dividers 111) of the flow guide structure 150 may each act as a pre-heat ring for each flow level 153. The one or more flow dividers 111 can be referred to as one or more pre-heat rings.

As described below, the present disclosure contemplates that the flow guide structure 150 can be omitted.

During operations (such as during an epitaxial deposition operation), one or more process gases P1 are supplied to the processing volume 128 through the inner supply conduit system 121 and the outer supply conduit system 122, and through the plurality of gas inject passages 182. The one or more process gases P1 are supplied from one or more gas sources 196 in fluid communication with the plurality of gas inject passages 182. Each of the gas inject passages 182 is configured to direct the one or more processing gases P1 in a generally radially inward direction towards the cassette 1030. As such, in one or more embodiments, the gas inject passages 182 may be part of a cross-flow gas injector. The flow(s) of the one or more process gases P1 can be divided into the plurality of flow levels 153. In one or more embodiments, the plate assembly 300 separates the processing volume 128 from an upper section 131 of the internal volume 124. For at least the uppermost flow level 153 (or a single flow level 153—if a single flow level 153 is used), the one or more process gases P1 can be guided (using the plate assembly 300) along a streamlined flow path such that diversive flow away from the uppermost substrate 107 (or a single substrate 107—if a single substrate 107 is used) is reduced or eliminated. The plate assembly 300 can facilitate a more uniform flow of the one or more process gases P1 along the uppermost flow level 153 relative to the other flow levels 153 below the uppermost flow level 153.

The processing apparatus 100 includes an exhaust conduit system 190. The one or more process gases P1 can be exhausted through exhaust gas openings formed in the one or more liners 180, exhaust gas channels formed in the chamber body 130, and then through exhaust gas boxes 1091. The one or more process gases P1 can flow from exhaust gas boxes 1091 and to an optional common exhaust box 1092, and then out through a conduit using one or more pump devices 197 (such as one or more vacuum pumps).

The one or more processing gases P1 can include, for example, purge gases, cleaning gases, and/or deposition gases. The deposition gases can include, for example, one or more reactive gases carried in one or more carrier gases. The one or more reactive gases can include, for example, silicon and/or germanium containing gases (such as silane ($SiH_4$), disilane ($Si_2H_6$), dichlorosilane ($SiH_2Cl_2$), and/or germane ($GeH_4$)), chlorine containing etching gases (such as hydrogen chloride (HCl)), and/or dopant gases (such as phosphine ($PH_3$) and/or diborane ($B_2H_6$)). The one or more purge gases can include, for example, one or more of argon (Ar), helium (He), nitrogen ($N_2$), hydrogen chloride (HCl), and/or hydrogen ($H_2$).

Purge gas P2 supplied from a purge gas source 129 is introduced to a bottom region 105 of the internal volume 124 through one or more purge gas inlets 184 formed in the sidewall of the chamber body 130.

The one or more purge gas inlets 184 are disposed at an elevation below the gas inject passages 182. If the one or more liners 180 are used, a section of the one or more liners 180 may be disposed between the gas inject passages 182 and the one or more purge gas inlets 184. The one or more purge gas inlets 184 are configured to direct the purge gas P2 in a generally radially inward direction. The one or more purge gas inlets 184 may be configured to direct the purge gas P2 in an upward direction. During a film formation process, the substrate support assembly 119 is located at a position that can facilitate the purge gas P2 to flow generally along a flow path across a back side of the cassette 1030. The purge gas P2 exits the bottom region 105 and is exhausted out of the processing apparatus 100 through one or more purge gas exhaust passages 102 located on the opposite side of the processing volume 128 relative to the one or more purge gas inlets 184.

The substrate support assembly 119 includes a first support frame 199 and a second support frame 198 disposed at least partially about the first support frame 199. The first support frame 199 includes arms coupled to the cassette 1030 such that lifting and lowering the first support frame 199 lifts and lowers the cassette 1030. A plurality of lift pins 189 are suspended from the cassette 1030. Lowering of the cassette 1030 and/or lifting of the second support frame 198 initiates contact of the lift pins 189 with arms of the second support frame 198. Continued lowering of the cassette 1030 and/or lifting of the second support frame 198 initiates contact of the lift pins 189 with the substrates in the cassette 1030 such that the lift pins 189 raise the substrates in the cassette 1030. A bottom region 105 of the processing apparatus 100 is defined between the floor 134 and the cassette 1030.

A first shaft 126 of the first support frame 199, a second shaft 125 of the second support frame 198, and a section 151 of the lower window 115 extend through a port formed in a bottom 135 of the chamber body 130 and the floor 134. Each shaft 125, 126 is coupled to one or more respective motors 164, which are configured to independently raise, lower, and/or rotate the cassette 1030 using the first support frame 199, and to independently raise and lower the lift pins 189 using the second support frame 198. The first support frame 199 includes the first shaft 126 and a plurality of first arms 1021 configured to support the cassette 1030 that includes one or more substrate supports 112. The cassette 1030 includes a plurality of mount columns 1081 that support the arcuate supports 112.

The second support frame 198 includes the second shaft 125 and a plurality of second arms 1022 configured to interface with and support the lift pins 189. A bellows assembly 158 circumscribes and encloses a portion of the shafts 125, 126 disposed outside the chamber body 130 to facilitate reduced or eliminated vacuum leakage outside the chamber body 130.

An opening 136 (a substrate transfer opening) is formed through the one or more sidewalls of the chamber body 130. The opening 136 may be used to transfer the substrates 107 to or from the cassette 1030, e.g., in and out of the internal volume 124. In one or more embodiments, the opening 136 includes a slit valve. In one or more embodiments, the opening 136 may be connected to any suitable valve that enables the passage of substrates therethrough. The opening 136 is shown in ghost in FIGS. 1 and 2 for visual clarity purposes.

The processing apparatus 100 may include one or more sensors 191, 192, 282, such as temperature sensors (e.g., optical pyrometers) or other metrology sensors, which measure temperatures (or other parameters) within the processing apparatus 100 (such as on the surfaces of the upper window 116, surfaces of the plate assembly 300, and/or one or more surfaces of the substrates 107, the flow guide structure 150, and/or the cassette 1030). The one or more sensors 191, 192 are disposed on the lid 104. The one or more sensors 282 (e.g., lower pyrometers)—which are shown in FIG. 2—are disposed on a lower side of the lower window 115. The one or more sensors 282 can be disposed adjacent to and/or on the bottom 135 of the chamber body 130.

In one or more embodiments, upper sensors 191, 192 are oriented toward a top of the cassette 1030, the plate assembly 300, and/or a top of the flow guide structure 150. In one or more embodiments, side sensors 281 (e.g., side temperature sensors) are oriented toward substrate supports 112 of the cassette 1030. In one or more embodiments, lower sensors 282 are oriented toward a bottom of the cassette 1030 (such as a lower surface of the cassette plate 1032), a bottom of the plate assembly 300, and/or a bottom of the flow guide structure 150.

The processing apparatus 100 includes a controller 1070 configured to control the processing apparatus 100 or components thereof. For example, the controller 1070 may control the operation of components of the processing apparatus 100 using a direct control of the components or by controlling controllers associated with the components. In operation, the controller 1070 enables data collection and feedback from the respective chambers to coordinate and control performance of the processing apparatus 100.

The controller 1070 generally includes a central processing unit (CPU) 1071, a memory 1072, and support circuits 1073. The CPU 1071 may be one of any form of a general purpose processor that can be used in an industrial setting. The memory 1072, or non-transitory computer readable medium, is accessible by the CPU 1071 and may be one or more of memory such as random access memory (RAM), read only memory (ROM), floppy disk, hard disk, or any other form of digital storage, local or remote. The support circuits 1073 are coupled to the CPU 1071 and may include cache, clock circuits, input/output subsystems, power supplies, and the like.

The various methods (such as the method 1700) and operations disclosed herein may generally be implemented under the control of the CPU 1071 by the CPU 1071 executing computer instruction code stored in the memory 1072 (or in memory of a particular processing chamber) as, e.g., a software routine. When the computer instruction code is executed by the CPU 1071, the CPU 1071 controls the components of the processing apparatus 100 to conduct operations in accordance with the various methods and operations described herein. In one embodiment, which can be combined with other embodiments, the memory 1072 (a non-transitory computer readable medium) includes instructions stored therein that, when executed, cause the methods (such as the method 1700) and operations (such as the operations 1702-1712) described herein to be conducted. The controller 1070 can be in communication with the heat sources, the gas sources, and/or the vacuum pump(s) of the processing apparatus 100, for example, to cause a plurality of operations to be conducted.

FIG. 2 is a schematic cross-sectional side view of the processing apparatus 100 shown in FIG. 1, according to one implementation. The cross-sectional view shown in FIG. 2 is rotated by 55 degrees relative to the cross-sectional view shown in FIG. 1.

The processing apparatus 100 includes one or more side heat sources 118a, 118b (e.g., side lamps, side resistive heaters, side LEDs, and/or side lasers, for example) positioned outwardly of the processing volume 128. One or more second side heat sources 118b are opposite one or more first side heat sources 118a across the processing volume 128.

In FIG. 2, the flow guide structure 150 is not shown for visual clarity purposes. Additionally, the present disclosure contemplates that the flow guide structure 150 can be omitted from the processing apparatus 100 shown in FIGS. 1-2. In such an implementation, the one or more process gases P1 flow into an outer annulus of the processing volume 128 from the gas inject passages 182, and then flow into openings 216 between and outwardly of the substrate supports 112 (e.g., arcuate supports) of the cassette 1030, and then into gaps between the substrates 107. The one or more process gases P1 flow out of the gaps, into the openings 216 (between and outwardly of the substrate supports 112) on an exhaust side of the substrates 107, into the outer annulus of the processing volume 128, and into the one or more gas exhaust passages 172. The present disclosure also contemplates that a plurality of lines (such as conduits) in the processing volume 128 can connect each of the gas inject passages 182 to each of the inlet openings of the cassette 1030.

In addition to the one or more sensors 191, 192 positioned above the processing volume 128 and above the second shield plate 1062, the processing apparatus 100 may include one or more sensors 281, such as temperature sensors (e.g., optical pyrometers) or other metrology sensors, which measure temperatures (or other parameters) within the processing apparatus 100 (such as on the surfaces of the upper window 116, on the surfaces of the plate assembly 300, and/or one or more surfaces of the substrates 107, a plurality of windows 257, and/or the cassette 1030). The plurality of windows 257—if used—can be disposed in gaps between or formed in the one or more liners 180 (such as the upper liner 181 and/or the one or more lower liners 183). The one or more sensors 281 are side sensors (e.g., side pyrometers) that are positioned outwardly of the processing volume 128, outwardly of the flow guide structure 150, and outwardly of the plurality of windows 257. The one or more sensors 281 can be radially aligned, for example, with the plurality of windows 257 (as shown in FIG. 2).

The one or more side sensors 281 (such as one or more pyrometers) can be used to measure temperatures within the processing volume 128 from respective sides of the processing volume 128. The side sensors 281 are arranged in a plurality of sensor levels (three sensor levels are shown in FIG. 2). In one or more embodiments, the number of sensor levels is equal to the number of heat source levels. Each side sensor 281 can be oriented horizontally or can be directed (e.g., oriented downwardly at an angle) toward the substrate 107 and the substrate support 112 of a respective level of the cassette 1030.

The present disclosure contemplates that the side heat sources 118a, 118b, the windows 257, and/or the side sensors 281 can be omitted.

Figures 3, 4:
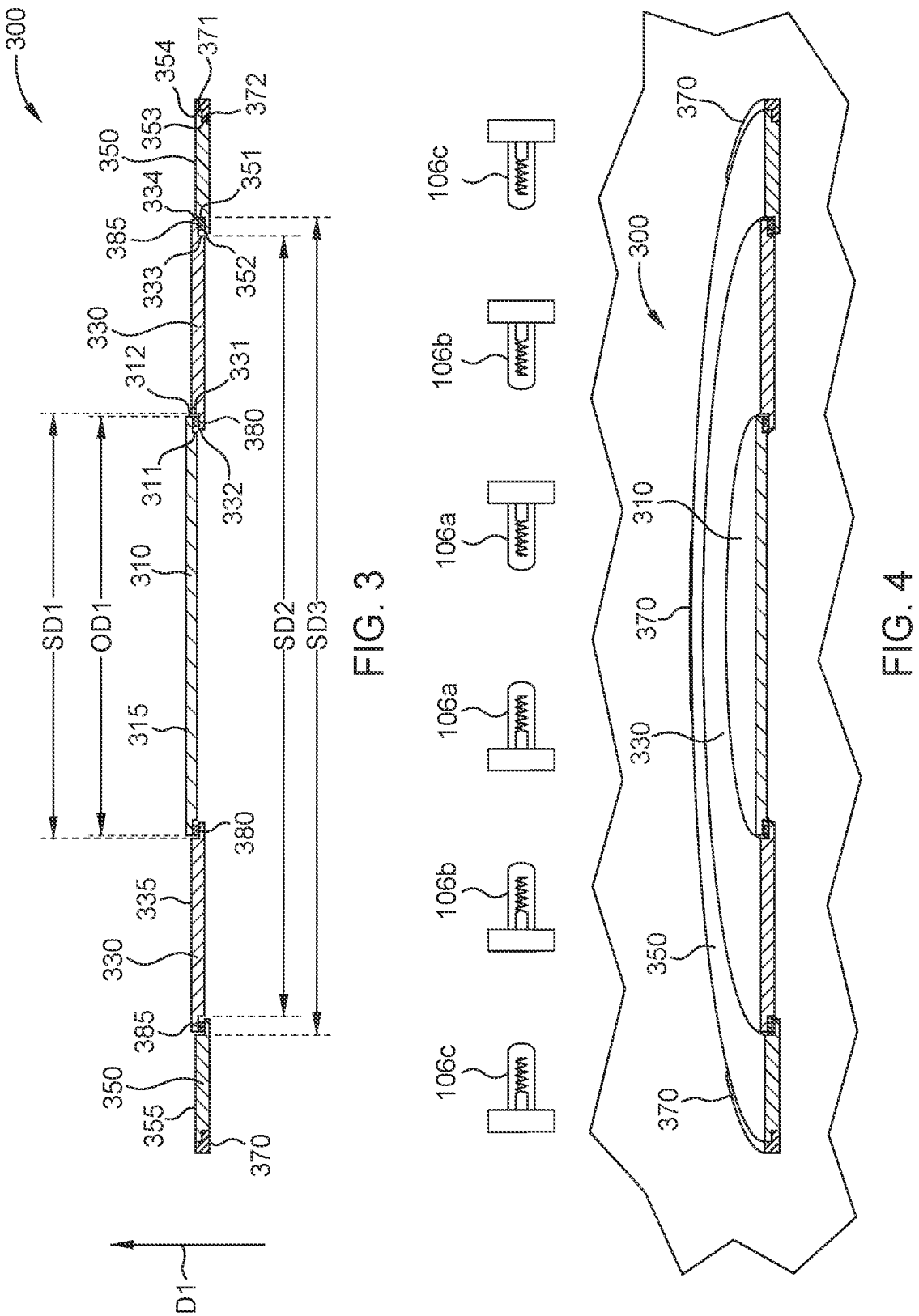
FIG. 3 is a schematic enlarged view of the plate assembly shown in FIGS. 1 and 2, according to one implementation.
FIG. 4 is a schematic partial enlarged axonometric view of the plate assembly shown in FIG. 3, according to one implementation.

FIG. 3 is a schematic enlarged view of the plate assembly 300 shown in FIGS. 1 and 2, according to one implementation.

FIG. 4 is a schematic partial enlarged axonometric view of the plate assembly 300 shown in FIG. 3, according to one implementation.

The plate assembly 300 includes an inner section 310. In one or more embodiments, the inner section 310 is circular in shape (e.g., disc-shaped). The present disclosure contemplates that the circular shape of the inner section 310 can include a regular circle. The present disclosure also contemplates that the circular shape of the inner section 310 can include one or more openings (such as notches) in an outer edge of the circular shape such that the outer edge is not a continuous circle. As an example, the circular shape of the inner section 310 can include an irregular circle. The inner section 310 has an outer diameter OD1. The outer diameter OD1 is lesser than the inner liner diameter ID1 of the upper liner 181 shown in FIG. 1. The inner section 310 includes a shoulder 311 and a lip 312 extending outwardly relative to the shoulder 311.

The plate assembly 300 includes one or more outer sections 330, 350, 370 that are arcuate in shape. The plate assembly 300 includes a first outer section 330 that is arcuate in shape (e.g., ring-shaped). The first outer section 330 includes a first inner shoulder 331 and a first inner lip 332 extending inwardly relative to the first inner shoulder 331. The first outer section 330 includes a first outer shoulder 333, and a first outer lip 334 extending outwardly relative to the first outer shoulder 333. The first inner shoulder 331 has a first shoulder diameter SD1 that is equal to or greater than the outer diameter OD1 of the inner section 310. The first outer shoulder 333 has a second shoulder diameter SD2 that is greater than the first shoulder diameter SD1.

The plate assembly 300 includes a second outer section 350 that is arcuate in shape (e.g., ring-shaped). The second outer section 350 includes a second inner shoulder 351, and a second inner lip 352 extending inwardly relative to the second inner shoulder 351. The second outer section 350 includes a second outer shoulder 353, and a second outer lip 354 extending outwardly relative to the second outer shoulder 353. The second inner shoulder 351 has a third shoulder diameter SD3 that is equal to or greater than the second shoulder diameter SD3.

The plate assembly 300 includes a third outer section 370 that is arcuate in shape (e.g., ring-shaped). The third outer section 370 includes a third inner shoulder 371, and a third inner lip 372 extending inwardly relative to the third inner shoulder 371. The third outer section 370 can include a plurality of ring segments that are spaced from each other circumferentially. The third outer section 370 is an outermost section that is sized and shaped to interface with the upper liner 181 shown in FIG. 1. In one or more embodiments, the third outer section 370 is retained at least partially in the recess 109 of the upper liner 181 (as shown in FIG. 1). In one or more embodiments, the third outer section 370 is supported by a ledge of the upper liner 181. In one or more embodiments, the third outer section 370 is omitted, and the second outer section 350 is supported by a ledge of the upper liner 181.

In one or more embodiments, the inner section 310 includes a disc body, the first outer section 330 includes a first ring body, and the second outer section 350 includes a second ring body. Each section 310, 330, 350 is a segment of the plate assembly 300. The sections 310, 330, 350 are supported using gravity. The second outer section 350 is at least partially supported using the upper liner 181, the first outer section 330 is at least partially supported using the second outer section 350, and the inner section 310 is at least partially supported using the first outer section 330.

In one or more embodiments, the inner section 310, the first outer section 330, the second outer section 350, and the third outer section 370 each includes an opaque material. Each outer section can be at least partially (such as completely) formed of the opaque material, and/or can be coated with the opaque material. The opaque material can absorb at least 80% (such as 95% or more) of light having a wavelength in the infrared range. In one or more embodiments, the opaque material includes one or more of silicon carbide (SiC), graphite coated with SiC, opaque quartz (e.g., white quartz), and/or black quartz.

The plate assembly 300 includes one or more first spacers 380 sized and shaped for disposition between the lip 312 of the inner section 310 and the first inner lip 332 of the first outer section 330. As an example, a height of the one or more first spacers 380 can be smaller than a value equal to a height of the shoulder 311 added together with a height of the first inner shoulder 331. As an example, a width of the one or more first spacers 380 can be smaller than a width of the lip 312 and smaller than a width of the first inner lip 332. The one or more first spacers 380 can be separately formed from the inner section 310 and the first outer section 330 (as shown in FIG. 3), or the one or more first spacers 380 can be integrally formed with the inner section 310 and/or the first outer section 330 (such that the one or more first spacers 380 are one or more protrusions). The one or more first spacers 380 can abut against the lip 312 and the first inner lip 332 (as shown in FIG. 3), or the one or more first spacers 380 can be recessed into the lip 312 and/or the first inner lip 332.

The plate assembly 300 includes one or more second spacers 385 sized and shaped for disposition between the first outer lip 334 of the first outer section 330 and the second inner lip 352 of the second outer section 350. As an example, a height of the one or more second spacers 385 can be smaller than a value equal to a height of the first outer shoulder 333 added together with a height of the second inner shoulder 351. As an example, a width of the one or more second spacers 385 can be smaller than a width of the first outer lip 334 and smaller than a width of the second inner lip 352. The one or more second spacers 385 can be separately formed from the first outer section 330 and the second outer section 350 (as shown in FIG. 3), or the one or more second spacers 385 can be integrally formed with the first outer section 330 and/or the second outer section 350 (such that the one or more second spacers 385 are one or more protrusions).

The first and second spacers 380, 385 facilitate reduced contact areas between the sections 310, 330, 350 of the plate assembly 300, and increased zonal adjustability and control among the sections 310, 330, 350.

The one or more second spacers 385 can abut against the first outer lip 334 and the second inner lip 352 (as shown in FIG. 3), or the one or more second spacers 385 can be recessed into the first outer lip 334 and/or the second inner lip 352.

The present disclosure contemplates that one or more purge gases can be supplied to the upper section 131 while flowing the one or more process gases P1. The lips of the plate assembly 300 (such as the lip 312, the first inner lip 332, the first outer lip 334, and the second inner lip 352) facilitate reduced or eliminated leakage of gases past the plate assembly 300 and between the upper section 131 and the processing volume 128. For example, leakage of the one or more purge gases (if used) from the upper section 131 and into the processing volume 128, and associated dilution of the one or more process gases P1, is reduced or eliminated.

The first and second spacers 380, 385 can include a transparent material (such as transparent quartz) and/or the opaque material. The transparent material transmits at least 80% (such as at least 95%) of light having a wavelength in the infrared range. In one or more embodiments, the first and second spacers 380, 385 are formed of a material that is different than the material of the sections 310, 350, 370. In one or more embodiments, the first and second spacers 380, 385 are formed of a transparent material.

In one or more embodiments, the inner section 310 includes the transparent material or the opaque material, and at least one of the one or more outer sections 330, 350, 370 includes the other of the transparent material or the opaque material. Sensor(s) (such as the sensors 191 and/or 192) can align with the transparent material to see through the transparent material for measurements. In one or more embodiments, the inner section 310 is formed of the transparent material or the opaque material, and at least one of the one or more outer sections 330, 350, 370 is formed of the other of the transparent material or the opaque material.

A first set 106*a* of the upper heat sources 106 are aligned with the inner section 310 to facilitate heating and adjusting the temperature of first zone(s) of the substrate(s) 107 that align with the inner section 310. A second set 106*b* of the upper heat sources 106 are aligned with the first outer section 330 to facilitate heating and adjusting the temperature of second zone(s) of the substrate(s) 107 that align with the first outer section 330. A third set 106*c* of the upper heat sources 106 are aligned with the second outer section 350 to facilitate heating and adjusting the temperature of third zone(s) of the substrate(s) 107 that align with the second outer section 350. In one or more embodiments, the plate assembly 300 can be used to heat the zones of the substrate(s) 107 using at least indirect radiation supplied using the upper heat sources 106.

The plate assembly 300 is configured in a staircase arrangement such that upper outer surfaces of the inner section 310 and outer sections 330, 350 step upwardly in a radial direction that points inwardly towards a center of the plate assembly 300. A outer surface 315 of the inner section 310 is positioned above one or more arcuate outer surfaces 335, 355 of the first and second outer sections 330, 350 along a direction D1 from the substrate support assembly 119 and toward the plate assembly 300. In one or more embodiments, the outer surface 315 is circular in shape. The present disclosure contemplates that the circular shape of the outer surface 315 can include a regular circle. The present disclosure contemplates that the circular shape of the outer surface 315 can include one or more openings (such as notches) in an outer edge of the circular shape such that the outer edge is not a continuous circle. As an example, the circular shape of the outer surface 315 can include an irregular circle. In one or more embodiments, one or more surfaces of the sections 310, 330, 350 that receive heat (such as the outer surface 315 and/or the one or more arcuate outer surfaces 335, 355) are textured (e.g., smoothened) and/or coated to increase an emissivity and/or an absorptivity of the respective sections 310, 330, 350. In one or more embodiments, the one or more outer surfaces are smoothened by using polishing (e.g., using chemical polishing, mechanical polishing, and/or chemical mechanical polishing). An abrasive material may be used to smoothen the one or more outer surfaces. Other smoothening techniques may be used. In one or more embodiments, the one or more outer surfaces are smoothened, and then the coating is formed over the smoothened one or more outer surfaces. In one or more embodiments, outer surface(s) of the coating are smoothened. In one or more embodiments, the smoothened one or more outer surfaces have an average surface roughness (Ra) that is less than 1.5, for example 1.0 or less, such as 0.75 or less. In one or more embodiments, the respective sections 310, 330, 350 have an emissivity and/or an absorptivity for radiation energy in the infrared wavelength range that is 0.80 or higher, such as 0.90 or higher, for example 0.95 or higher. In one or more embodiments, one or more of the respective sections 310, 330, 350 are selectively smoothened, and/or coated in one or more regions relative to one or more other regions that are not smoothened and/or coated.

The coating is formed of a material that is different than the material of the respective section 310, 330, 350. In one or more embodiments, the respective section 310, 330, 350 includes graphite, and the coating includes silicon carbide (SiC). In one or more embodiments, the coating includes quartz (such as opaque quartz (e.g., white quartz) and/or black quartz).

During processing, the inner section 310 of the plate assembly 300 is disposed at a distance DS1 from the uppermost substrate 107. In one or more embodiments, the distance DS1 is within a range of 0.5 mm to 2.0 mm, such as 0.8 mm to 1.02 mm, for example 1.0 mm.

Figure 5:
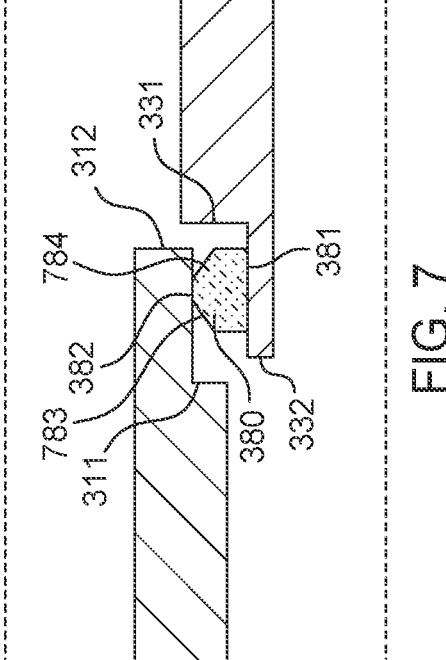
FIG. 5 is an enlarged view of one of the one or more first spacers shown in FIGS. 3 and 4, according to one implementation.

FIG. 5 is an enlarged view of one of the one or more first spacers 380 shown in FIGS. 3 and 4, according to one implementation. In one or more embodiments, the one or more first spacers 380 and/or the one or more second spacers 385 have a rectangular cross-section (as shown in FIG. 5), such as a square cross-section. In one or more embodiments, the one or more first spacers 380 and/or the one or more second spacers 385 comprise one or more outer surfaces 381, 382 that are planar (as shown in FIG. 5).

Figure 6:
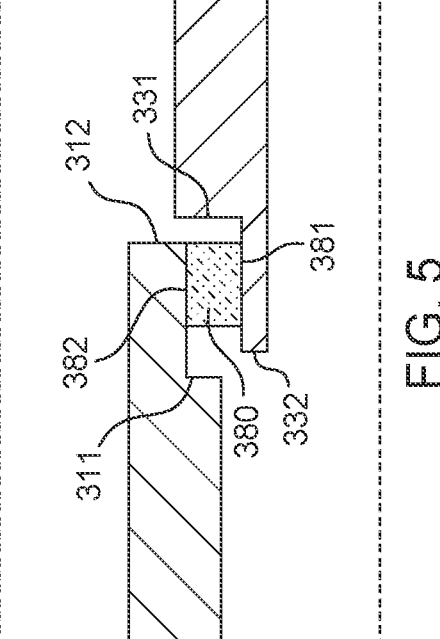
FIG. 6 is an enlarged view of one of the one or more first spacers shown in FIGS. 3 and 4, according to one implementation.

FIG. 6 is an enlarged view of one of the one or more first spacers 380 shown in FIGS. 3 and 4, according to one implementation. In one or more embodiments, the one or more first spacers 380 and/or the one or more second spacers 385 have a semi-ball shaped cross-section (as shown in FIG. 6), such as a semi-spherical or semi-ovular cross-section. In one or more embodiments, the one or more first spacers 380 and/or the one or more second spacers 385 comprise one or more outer surfaces 381 that are planar and one or more outer surfaces 683 that are arcuate (as shown in FIG. 6).

Figure 7:
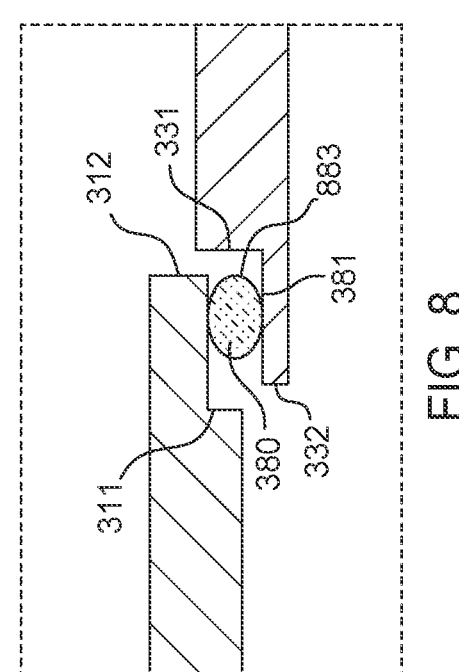
FIG. 7 is an enlarged view of one of the one or more first spacers shown in FIGS. 3 and 4, according to one implementation.

FIG. 7 is an enlarged view of one of the one or more first spacers 380 shown in FIGS. 3 and 4, according to one implementation. In one or more embodiments, the one or more first spacers 380 and/or the one or more second spacers 385 have a semi-trapezoidal shaped cross-section (as shown in FIG. 7). In one or more embodiments, the one or more first spacers 380 and/or the one or more second spacers 385 comprise one or more outer surfaces 381, 382 that are planar and one or more outer surfaces 783, 784 that are tapered (as shown in FIG. 7).

Figure 8:
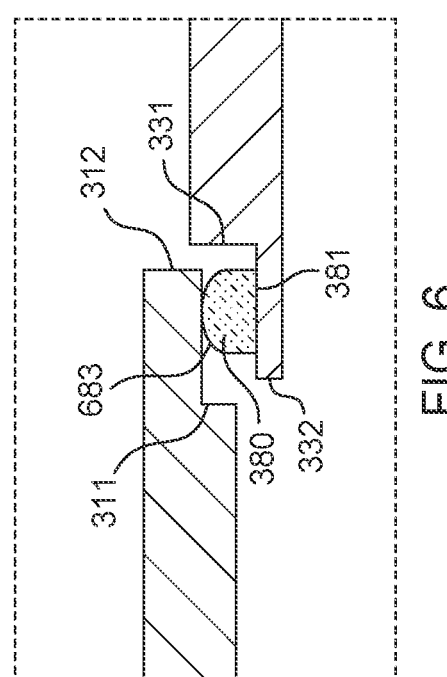
FIG. 8 is an enlarged view of one of the one or more first spacers shown in FIGS. 3 and 4, according to one implementation.

FIG. 8 is an enlarged view of one of the one or more first spacers 380 shown in FIGS. 3 and 4, according to one implementation. In one or more embodiments, the one or more first spacers 380 and/or the one or more second spacers 385 have a ball shaped cross-section (as shown in FIG. 8), such as a spherical or ovular cross-section. In one or more embodiments, the one or more first spacers 380 and/or the one or more second spacers 385 comprise one or more outer surfaces 883 that are arcuate (as shown in FIG. 8).

Figure 9:
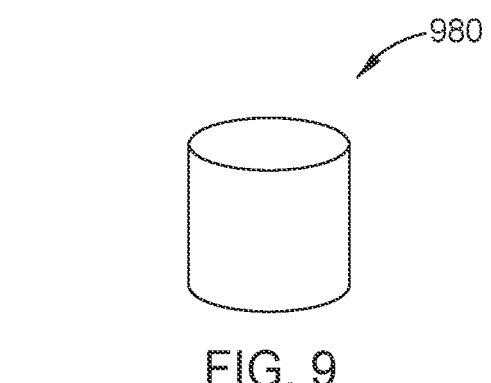
FIG. 9 is a schematic axonometric view of a spacer, according to one implementation.

FIG. 9 is a schematic axonometric view of a spacer 980, according to one implementation. The spacer 980 can be used as one or more of the one or more first spacers 380 and/or the one or more second spacers 385. The spacer 980 includes a pin.

Figure 10:
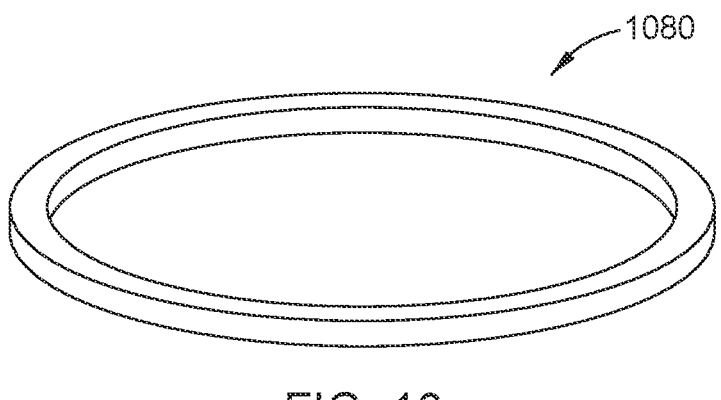
FIG. 10 is a schematic axonometric view of a spacer, according to one implementation.

FIG. 10 is a schematic axonometric view of a spacer 1080, according to one implementation. The spacer 1080 can be used as one or more of the one or more first spacers 380 and/or the one or more second spacers 385. The spacer 1080 includes a ring.

Figure 11:
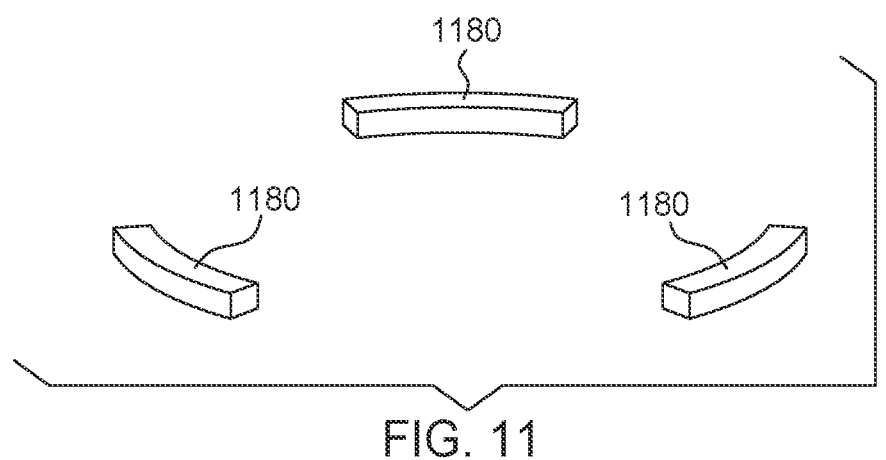
FIG. 11 is a schematic axonometric view of a plurality of spacers, according to one implementation.

FIG. 11 is a schematic axonometric view of a plurality of spacers 1180, according to one implementation. The spacers 1180 can be used as one or more of the one or more first spacers 380 and/or the one or more second spacers 385. Each of the spacers 1180 includes a ring segment.

Figures 12, 13:
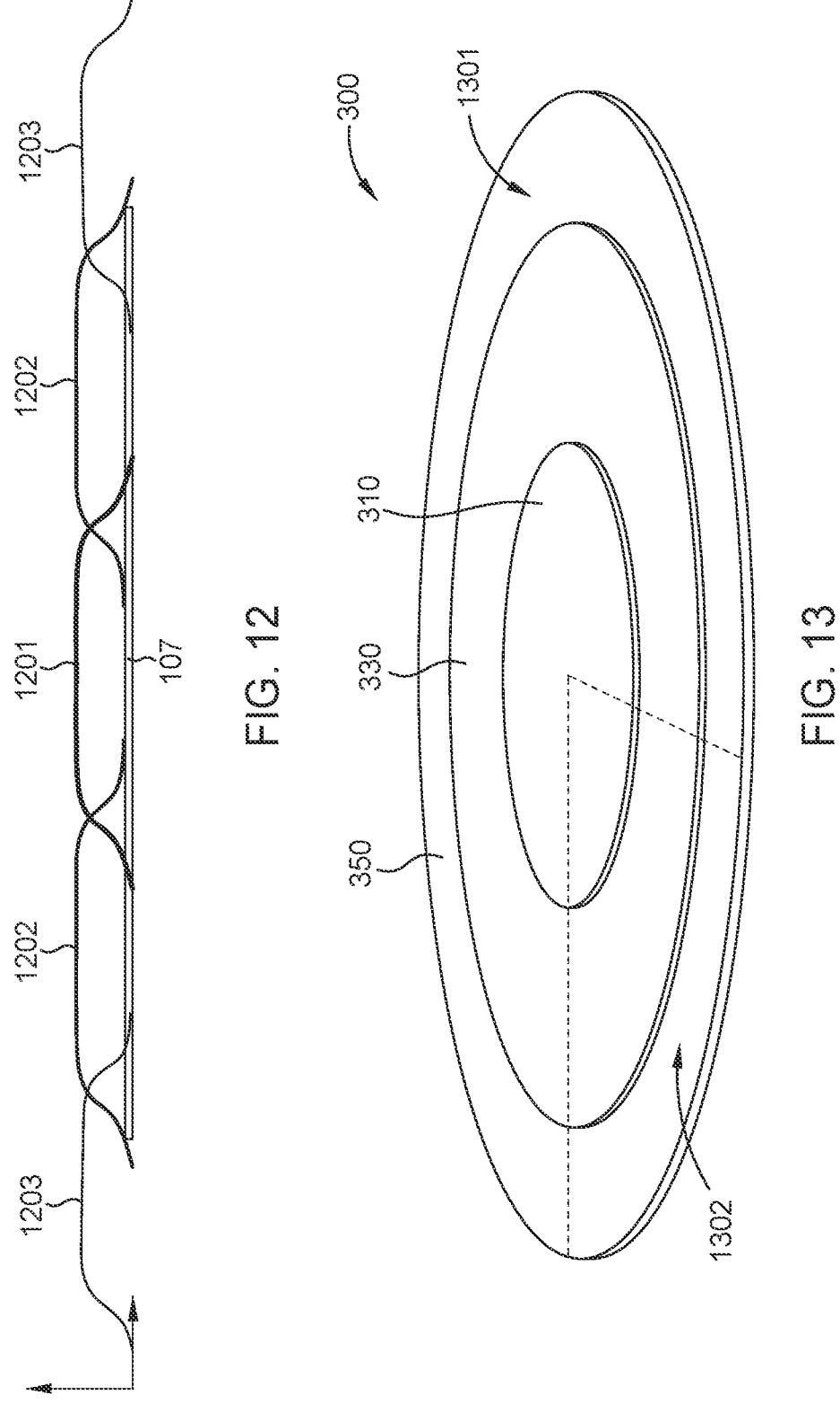
FIG. 12 is a schematic graphical view of heating profiles for various zones of the uppermost substrate, according to one implementation.
FIG. 13 is a partial schematic axonometric top view of the plate assembly shown in FIGS. 3 and 4, according to one implementation.

FIG. 12 is a schematic graphical view of heating profiles 1201, 1202, 1203 for various zones of the uppermost substrate 107, according to one implementation. The heating profiles 1201, 1202, 1203 are created using the plate assembly 300 shown in FIGS. 3 and 4.

A first zone profile 1201 shows a profile of heating of a first zone of the uppermost substrate 107 that is aligned under the inner section 310. Second zone profiles 1202 show profiles of heating of second zones of the uppermost substrate 107 that are aligned under the first outer section 330. Third zone profiles 1203 show profiles of heating of third zones of the uppermost substrate 107 that are aligned under the second outer section 350.

As shown by the profiles 1201, 1202, 1203 heating of the substrate 107 across the entirety of a diameter of the substrate 107 is more uniform (relative to other configurations) when using the plate assembly 300. Additionally, power to the various heat sources that align respectively with the sections 310, 330, 350 can be adjusted to make the heating of the various zones more uniform for a more uniform center-to-edge deposition thickness.

FIG. 13 is a partial schematic axonometric top view of the plate assembly 300 shown in FIGS. 3 and 4, according to one implementation.

Each of the inner section 310, the first outer section 330, and the second outer section 350 includes a first portion 1301 formed of the opaque material, and a second portion 1302 formed of the transparent material. The second portion 1302 extends radially outward relative to a center of the respective inner section 310, first outer section 330, or second outer section 350. Sensor(s) (such as the sensors 191 and/or 192) can align with the transparent material of the second portion 1302 to see through the transparent material for measurements.

FIG. 14 is a partial schematic axonometric bottom view of the plate assembly 300 shown in FIG. 13, according to one implementation. In FIG. 14, each of the one or more first spacers 380 and the one or more second spacers 385 includes a plurality of the pin of the spacer 980 shown in FIG. 9. In one or more embodiments, the one or more first spacers 380 include three or four spacers (four is shown in FIG. 14), and the one or more second spacers 385 include include three or four spacers (four is shown in FIG. 14). Other numbers of spacers are contemplated.

FIG. 15 is a partial schematic axonometric bottom view of the plate assembly 300 shown in FIG. 13, according to one implementation. In FIG. 15, each of the one or more first spacers 380 and the one or more second spacers 385 includes the ring of the spacer 1080 shown in FIG. 10.

Figures 16, 17:
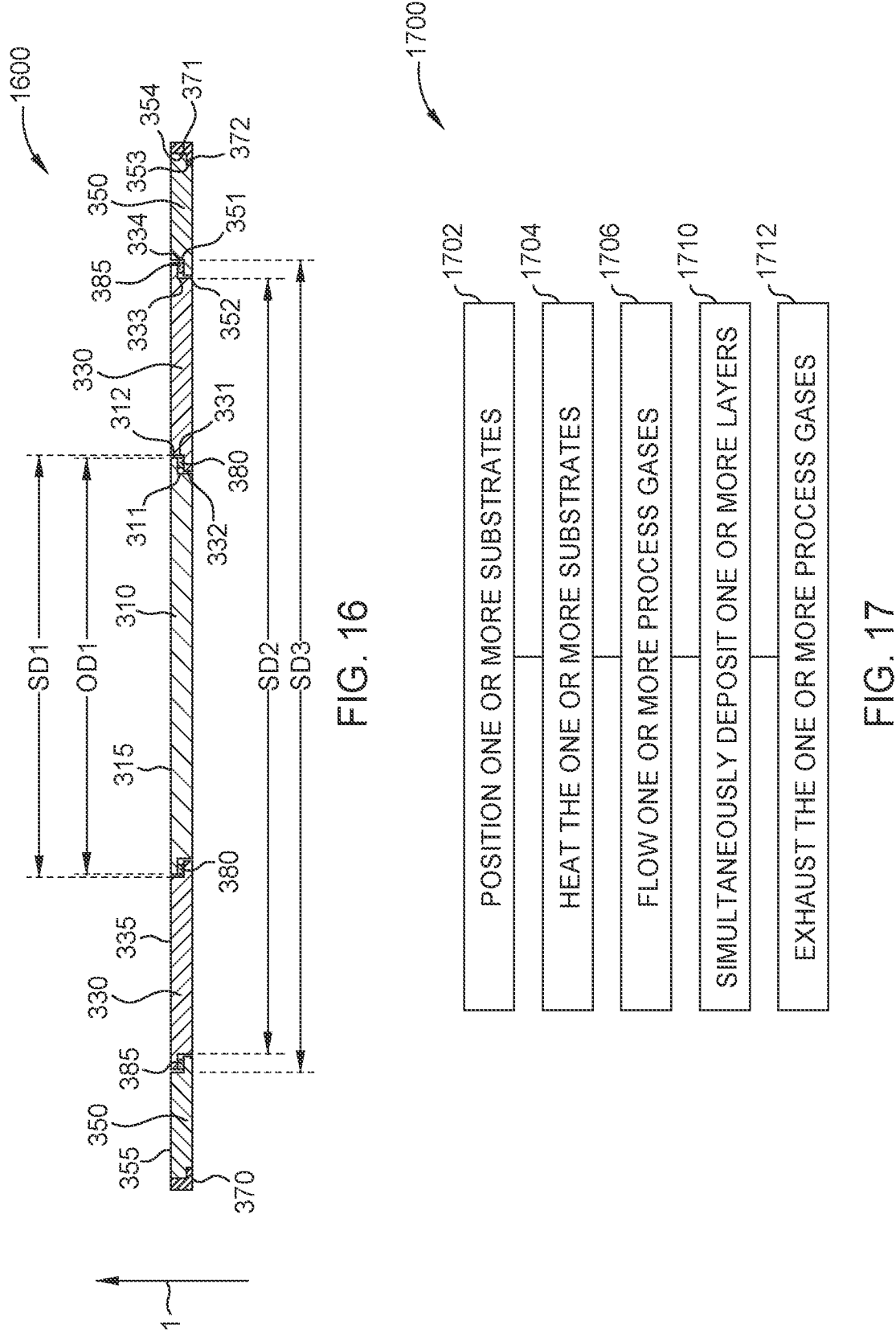
FIG. 16 is a schematic side cross-sectional view of a plate assembly, according to one implementation.
FIG. 17 is a schematic block diagram view of a method of processing substrates for semiconductor manufacturing, according to one implementation.

FIG. 16 is a schematic side cross-sectional view of a plate assembly 1600, according to one implementation. The plate assembly 1600 is similar to the plate assembly 300 shown in FIGS. 3 and 4, and includes one or more features, aspects, components, operations, and/or properties thereof. The plate assembly 1600 can be used in place of the plate assembly 300 shown in FIGS. 1 and 2.

The plate assembly 1600 is configured in a flat arrangement such that upper outer surfaces of the inner section 310 and outer sections 330, 350 are aligned with each other in a radial direction that points inwardly towards a center of the plate assembly 1600. The outer surface 315 of the inner section 310 is aligned with the one or more arcuate outer surfaces 335, 355 of the first and second outer sections 330, 350 along the direction D1 from the substrate support assembly 119 and toward the plate assembly 300. For the plate assembly 1600, height(s) of the one or more first spacers 380, the one or more second spacers 385, the lip 312, the first inner lip 332, the first outer lip 334, and/or the second inner lip 352 can be reduced relative to the height(s) shown in FIG. 3.

FIG. 17 is a schematic block diagram view of a method 1700 of processing substrates for semiconductor manufacturing, according to one implementation.

Operation 1702 of the method 700 includes positioning one or more substrates in a processing volume of a chamber.

Operation 1704 includes heating the one or more substrates. It is contemplated that operation 1704 may occur prior to, subsequent to, and/or concurrent with operation 1706.

Operation 1706 includes flowing one or more process gases into the processing volume.

Operation 1710 includes simultaneously depositing one or more layers on each of the one or more substrates.

Operation 1712 includes exhausting the one or more process gases from the processing volume. During the flowing of operation 1706 and/or the exhausting of operation 1712, the one or more process gases can follow the flow paths described herein (such as the flow paths described in relation to FIGS. 1 and 2).

Figure 18:
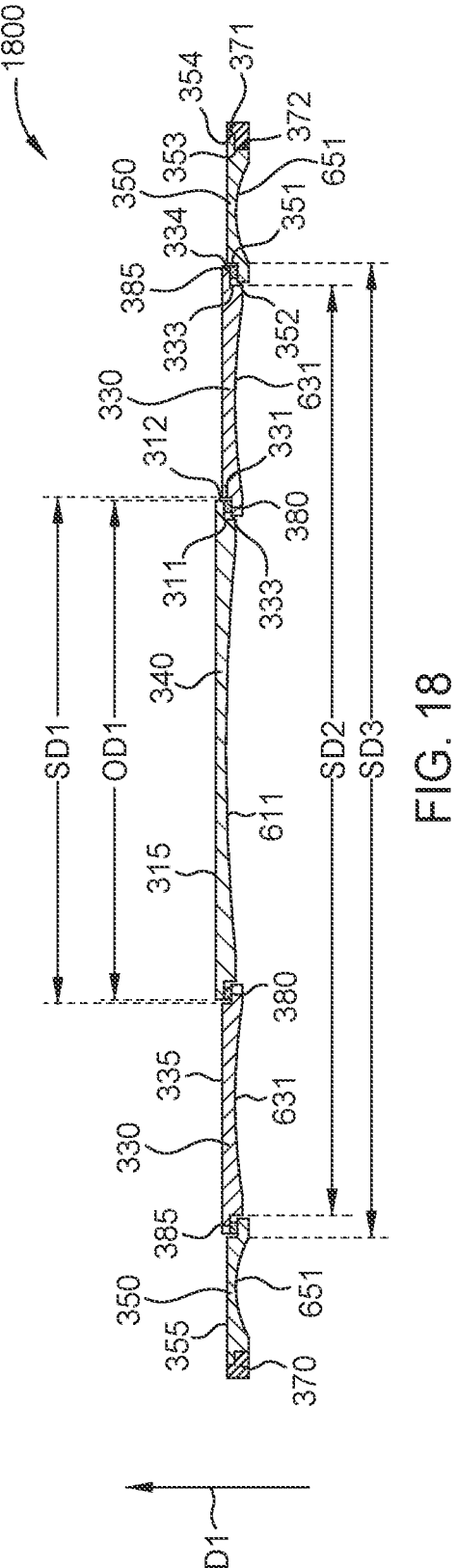
FIG. 18 is a schematic side cross-sectional view of a plate assembly, according to one implementation.

FIG. 18 is a schematic side cross-sectional view of a plate assembly 1800, according to one implementation. The plate assembly 1800 is similar to the plate assembly 300 shown in FIGS. 3 and 4, and includes one or more features, aspects, components, operations, and/or properties thereof. The plate assembly 1800 can be used in place of the plate assembly 300 shown in FIGS. 1 and 2.

The inner section 310 includes one or more arcuate outer surfaces 611. The first and second outer sections 330, 350 respectively include one or more arcuate outer surfaces 631, 651. The arcuate outer surfaces 611, 631, 651 are concave and face the uppermost substrate 107. In one or more embodiments, the arcuate outer surfaces 611, 631, 651 are defined by grooves having arcuate cross-sections formed in the respective inner and outer sections 310, 330, 350. The arcuate outer surfaces of the first and second outer sections 330, 350 are formed circumferentially and circumferentially (e.g., in the shape of a ring) about the one or more arcuate outer surfaces 611 of the inner section 310. In one or more embodiments, the one or more arcuate outer surfaces 611 of the inner section 310 are in the shape of a circle.

Figure 19:
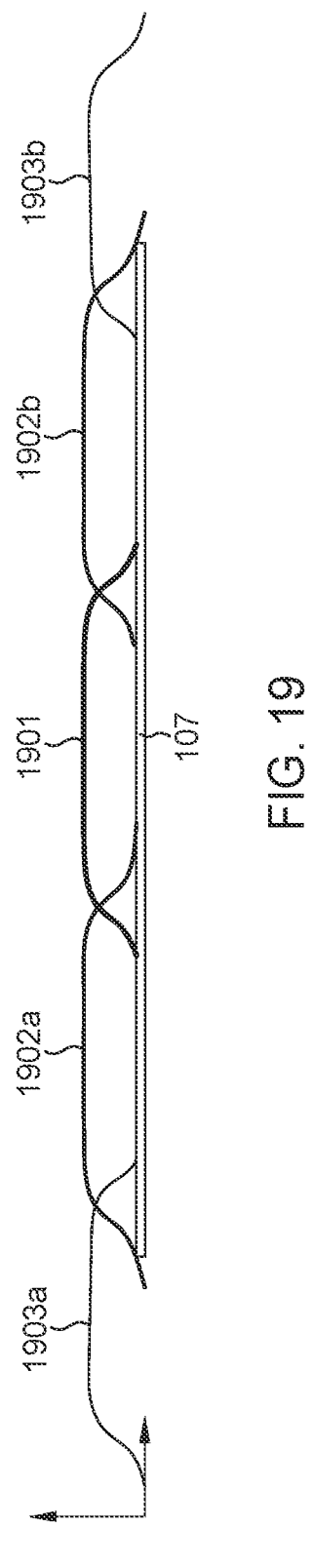
FIG. 19 is a schematic graphical view of heating profiles for various zones of the uppermost substrate, according to one implementation.

FIG. 19 is a schematic graphical view of heating profiles 1901, 1902*a*, 1902*b*, 1903*a*, 1903*b* for various zones of the uppermost substrate 107, according to one implementation. The heating profiles 1901, 1902*a*, 1902*b*, 1903*a*, 1903*b* are created using the plate assembly 1800 shown in FIG. 18.

A first zone profile 1901 shows a profile of heating of a first zone of the uppermost substrate 107 that is aligned under the inner section 310. Second zone profiles 1902*a*, 1902*b* show profiles of heating of second zones of the uppermost substrate 107 that are aligned under the first outer section 330. Third zone profiles 1903*a*, 1903*b* show profiles of heating of third zones of the uppermost substrate 107 that are aligned under the second outer section 350.

As shown by the profiles 1901, 1902*a*, 1902*b*, 1903*a*, 1903*b* heating of the substrate 107 across the entirety of a diameter of the substrate 107 is more uniform (relative to other configurations) when using the plate assembly 1800. Additionally, power to the various heat sources that align respectively with the sections 310, 330, 350 can be adjusted to make the heating of the various zones more uniform for a more uniform center-to-edge deposition thickness.

Benefits of the present disclosure include ease of cleaning (e.g., cleaning using relatively high temperatures while reducing or eliminating etching of the plate assemblies); reduced contamination of the plate assemblies 300, 1600, 1800; reduced diversive flow away from substrate(s) being processed; thermal control and adjustability for a plurality of zones; and quick and efficient heating of the zones (e.g., quickly absorbing and spreading radiation). As an example, the plate assemblies described herein facilitate thermal control and adjustability for a plurality of zones while facilitating reduced diversive flow. For example, the plate assemblies described herein facilitate thermal control and adjustability for two or more zones, such as four to eight or more zones. Benefits also include enhanced deposition uniformity, enhanced film thickness, and enhanced device performance.

Such benefits can be facilitated for processing a single substrate at a time, and/or batch processing a plurality of substrates simultaneously.

It is contemplated that one or more aspects disclosed herein may be combined. As an example, one or more aspects, features, components, operations, and/or properties of the various implementations of the processing apparatus 100, the controller 1070, the upper liner 181, the plate assembly 300, the spacer implementations shown in FIGS. 5-8, the pin of spacer 980, the ring of spacer 1080, the ring segments of spacers 1180, the plate assembly 300 implementations shown in FIGS. 13 and 14, the plate assembly 300 implementation shown in FIG. 15, the plate assembly 1600, the plate assembly 1800, and/or the method 1700 may be combined. Moreover, it is contemplated that one or more aspects disclosed herein may include some or all of the aforementioned benefits.

While the foregoing is directed to embodiments of the present disclosure, other and further embodiments of the disclosure may be devised without departing from the basic scope thereof, and the scope thereof is determined by the claims that follow.

What is claimed is:

1. A plate assembly for disposition in a processing chamber, comprising:

an inner section comprising an opaque material, the inner section having an outer diameter;

a first outer section that is arcuate in shape and comprises the opaque material, the first outer section comprising:
a first inner shoulder, and
a first inner lip extending inwardly relative to the first inner shoulder; and one or more spacers sized and shaped for disposition between the inner section and the first outer section, the one or more spacers comprising a transparent material.

2. The plate assembly of claim 1, wherein the one or more spacers are sized and shaped for disposition between the inner section and the first inner lip of the first outer section.

3. The plate assembly of claim 2, wherein the one or more spacers comprise a plurality of pins disposed between the inner section and the first outer section.

4. The plate assembly of claim 2, wherein the one or more spacers comprise one or more rings disposed between the inner section and the first outer section.

5. The plate assembly of claim 2, wherein the one or more spacers comprise one or more outer surfaces that are tapered or arcuate.

6. The plate assembly of claim 1, wherein the first outer section further comprises:
a first outer shoulder; and
a first outer lip extending outwardly relative to the first outer shoulder.

7. The plate assembly of claim 6, wherein the inner section includes a disc body and the first outer section includes a first ring body.

8. The plate assembly of claim 7, further comprising a second outer section that is arcuate in shape, the second outer section comprising:
a second inner shoulder; and
a second inner lip extending inwardly relative to the second inner shoulder.

9. The plate assembly of claim 8, wherein:
the one or more spacers are sized and shaped for disposition between the inner section and the first inner lip of the first outer section; and
the plate assembly further comprises one or more second spacers sized and shaped for disposition between the first outer lip of the first outer section and the second inner lip of the second outer section.

10. The plate assembly of claim 8, wherein the second outer section includes a second ring body.

11. The plate assembly of claim 8, wherein the first inner shoulder has a first shoulder diameter that is equal to or greater than the outer diameter of the inner section.

12. The plate assembly of claim 11, wherein the first outer shoulder has a second shoulder diameter that is greater than the first shoulder diameter, and the second inner shoulder has a third shoulder diameter that is equal to or greater than the second shoulder diameter.

13. The plate assembly of claim 8, wherein the second outer section further comprises:
a second outer shoulder; and
a second outer lip extending outwardly relative to the second outer shoulder.

14. The plate assembly of claim 13, further comprising a third outer section that is arcuate in shape, the third outer section comprising:
a third inner shoulder; and
a third inner lip extending inwardly relative to the third inner shoulder.

15. The plate assembly of claim 1, wherein each of the inner section and the first outer section comprises:

a first portion formed of the opaque material; and a second portion formed of a transparent material, the second portion extending radially outward relative to a center of the respective inner section or first outer section.

16. A process kit for disposition in a processing chamber, comprising:

a liner comprising an inner surface, the inner surface having an inner liner diameter; and a plate assembly, comprising:

an inner section having an outer diameter that is lesser than the inner liner diameter, and one or more outer sections that are arcuate in shape, the one or more outer sections comprising an outermost section sized and shaped to interface with the liner, the inner section comprising a transparent material or an opaque material, and at least one of the one or more outer sections comprising the other of the transparent material or the opaque material.

17. The process kit of claim 16, wherein the inner section is formed of a transparent material or an opaque material, and at least one of the one or more outer sections is formed of the other of the transparent material or the opaque material.

18. A processing chamber applicable for use in semiconductor manufacturing, comprising:

a chamber body comprising:

an internal volume, a plurality of gas inject passages formed in the chamber body, and one or more gas exhaust passages formed in the chamber body;

one or more heat sources configured to generate heat;

a liner disposed in the internal volume and lining at least part of one or more sidewalls of the chamber body, the liner comprising an inner surface;

a plate assembly disposed in the internal volume and at least partially defining a processing volume of the internal volume, the plate assembly comprising:

an inner section comprising an opaque material, one or more outer sections that are arcuate in shape and comprise the opaque material, the one or more outer sections comprising an outermost section interfacing with the liner, and one or more spacers sized and shaped for disposition between the inner section and a first outer section of the one or more outer sections, the one or more spacers comprising a transparent material; and a substrate support assembly positioned in the processing volume, the substrate support assembly comprising:

a plurality of lift pins, and one or more substrate supports.

19. The processing chamber of claim 18, wherein an outer surface of the inner section is positioned above one or more arcuate outer surfaces of the one or more outer sections along a direction from the substrate support assembly and toward the plate assembly.

20. The process kit of claim 16, wherein the plate assembly further comprises one or more spacers sized and shaped for disposition between the inner section and a first outer section of the one or more outer sections, and the one or more spacers comprise a transparent material.

\* \* \* \* \*